United States Patent
Blackham

(10) Patent No.: US 6,188,968 B1
(45) Date of Patent: Feb. 13, 2001

(54) REMOVING EFFECTS OF ADAPTERS PRESENT DURING VECTOR NETWORK ANALYZER CALIBRATION

(75) Inventor: David VerNon Blackham, Santa Rosa, CA (US)

(73) Assignee: Agilent Technologies Inc., Palo Alto, CA (US)

(*) Notice: Under 35 U.S.C. 154(b), the term of this patent shall be extended for 0 days.

(21) Appl. No.: 09/080,535

(22) Filed: May 18, 1998

(51) Int. Cl.[7] .................................................. G01R 27/28
(52) U.S. Cl. .............................................. 702/85; 324/601
(58) Field of Search .................................... 324/601, 638, 324/637; 702/85, 90, 91, 107

(56) References Cited

U.S. PATENT DOCUMENTS

| | | | |
|---|---|---|---|
| 5,175,492 | * 12/1992 | Wong et al. | 324/158 R |
| 5,311,440 | * 5/1994 | Hess, Jr. | 364/481 |
| 5,552,714 | * 9/1996 | Adamian et al. | 324/601 |
| 5,578,932 | * 11/1996 | Adamian | 324/601 |
| 5,666,059 | * 9/1997 | Heuermann et al. | 324/601 |
| 6,060,888 | * 5/2000 | Blackham et al. | 324/601 |
| 6,081,125 | * 6/2000 | Krekels et al. | 324/601 |

OTHER PUBLICATIONS

Dhaene et al., "Calibration and Normalization of Time Domain Network Analyzer Measurments", IEEE, 1994.*
Dibeneditto et al., "Adapter Correction in the Measurement of Two–Port Devices", IEEE, 1988.*
Randa et al., "Comparison of Adapter Characterization Methods", IEEE, 1999.*
Doug Rytting, Advances in Microwave Error Correction Techniques, RF & Microwave Measurement Symposium and Exhibition, Hewlett–Packard Company, 1987.

* cited by examiner

Primary Examiner—Patrick Assouad

(57) ABSTRACT

Effects of adapters present only during calibration of a network analyzer are removed. Scattering parameters are obtained for the adapters. For example, the scattering parameters for the adapters are obtained by characterizing the adapters. Systematic error terms for the calibration which remove adapters effects are generated using the scattering parameters for the adapters. In one embodiment, the scattering parameters for the adapters are used to pre-load adapter error terms into the network analyzer before the calibration. The calibration is then performed with the adapter error terms pre-loaded to generate systematic error terms for the calibration. In an alternative embodiment, the calibration is performed (without pre-loading error terms) in order to generate preliminary systematic error terms for the calibration. The preliminary systematic error terms and the scattering parameters for the adapter are used to generate the systematic error terms which do not include effects of the adapters.

14 Claims, 12 Drawing Sheets

REMOVING EFFECTS OF ADAPTERS PRESENT DURING VECTOR NETWORK ANALYZER CALIBRATION

BACKGROUND

The present invention concerns radio frequency and microwave network analyzers and pertains particularly to removing effects of adapters present during vector network analyzer calibration.

A radio frequency (RF) network analyzer system consists of a network analyzer. The network analyzer integrates a radio frequency source with built-in couplers for signal separation, a narrow band receiver, a display and a processor.

Measurement calibration is a process that improves measurement accuracy by using error correction arrays during signal processing to compensate for systematic measurement errors. Measurement calibration is also called Cal, accuracy enhancement, and error correction. Measurement errors are classified as random and systematic errors. Random errors, such as noise and connector repeatability are non-repeatable and not correctable by measurement calibration.

Systematic errors, such as directivity, matching, tracking and crosstalk, are the most significant errors in most RF measurements. Systematic errors are repeatable and for the most part correctable, though small residual errors may remain. These systematic errors may drift with time and temperature.

Systematic errors are due to system frequency response, isolation between the signal paths, and mismatch in the test setup. Frequency response errors (transmission and reflection tracking) account for non-ideal gain and delay which are functions of frequency.

Isolation errors result from energy leakage between signal paths. In transmission measurements, this leakage is called crosstalk. In reflection measurements, this leakage is called imperfect directivity. Directivity is the ability of the signal separation devices to separate forward traveling signals from reverse traveling signals.

Mismatch errors arise when a portion of an incident voltage wave undergoes undesired internal reflections. After multiple internal reflections the reflected wave recombines and introduces undesired variations to the unreflected portion of the incident wave. The level of mismatch error is proportional to the port reflection coefficient. The port reflection coefficient is the ratio of the voltage wave reflected from a port over the voltage wave incident to the port. Mismatch errors can arise from interactions of network analyzer source match with the network analyzer load match as well as source match interaction with the input match of the DUT and load match interaction with the output match of the DUT.

FIG. 4 shows a representation 70 of the systematic errors associated with the measurement of the forward s-parameters ($s_{11}$ and $s_{21}$). The forward systematic error terms are forward directivity ($e_{00}$), forward source match ($e_{11}$), forward reflection tracking ($e_{10}e_{01}$), forward crosstalk ($e_{30}$), forward load match ($e_{22}$), and forward transmission tracking ($e_{10}e_{32}$).

FIG. 5 shows a representation 80 of the systematic errors associated with the measurement of the reverse s-parameters ($s_{22}$, $s_{12}$). The reverse systematic error terms are reverse directivity ($e_{33}$), reverse source match ($e'_{22}$), reverse reflection tracking ($e_{23}e_{32}$), reverse crosstalk ($e_{03}$), reverse load match ($e'_{11}$), and reverse transmission tracking ($e_{23}e_{01}$).

In both FIG. 4 and FIG. 5, the s-parameters $s_{11a}$, $s_{21a}$, $s_{12a}$, and $s_{22a}$ represent the actual scattering parameters for the DUT.

FIG. 6 shows a combined representation 90 of representation 70 shown in FIG. 4 and representation 80 shown in FIG. 5. For representation 90 shown in FIG. 6, $e_{11}$ and $e_{22}$ will have two distinct values depending on whether forward or reverse s-parameters are being measured.

A network analyzer generally has several methods of measuring and compensating for the test system errors to varying degrees of accuracy. Each method removes one or more of the systematic errors through vector error correction. Vector error correction is the process characterizing the systematic errors by measuring calibration standards (devices with known s-parameters) then mathematically removing the effects of the systematic errors from subsequent measurements on various DUTs.

One method of calibration involves the use of shorts, opens, loads, and a thru (direct connection of network analyzer test ports). The opens, shorts and loads are used to calibrate each network analyzer port for reflection measurements. The network analyzer measures each standard across a defined frequency band using a pre-defined number of points. The measurement of the opens, shorts and loads are used to solve for directivity, source match and reflection tracking for each port. The thru is then connected and four measurements are made—forward reflection to characterize forward load match, reverse reflection to characterize reverse load match, forward transmission to characterize forward transmission tracking, and reverse transmission to characterize reverse transmission tracking. The accuracy of the load match measurements is enhanced by accounting for the effects of directivity, reflection tracking and source match determined from the preceding reflection calibrations. The accuracy of the transmission tracking measurements is enhanced by accounting for the effects of source match/load match interactions. Forward and reverse crosstalk are characterized by measuring transmission in both directions with loads connected to both test ports. For more information see Doug Rytting, *Advances in Microwave Error Correction Techniques, RF & Microwave Measurement Symposium and Exhibition*, Hewlett-Packard Company, 1987, pp. see pages 7–11.

When performing calibration, test port connectors are used to connect the network analyzer to the calibration standards. The test port connectors need not be insertable or of the same family. Typically, a separate calibration kit is required for each connector family. If connectors are non-insertable, an adapter removal calibration is often done which requires two separate calibrations. See Doug Rytting, *Advances in Microwave Error Correction Techniques, RF & Microwave Measurement Symposium and Exhibition*, Hewlett-Packard Company, 1987, pp. see pages 21–24.

In the simplest case, the test port connectors are insertable which means the two test ports will mate directly to each other without the DUT present. In this case, a single calibration kit is required to determine the vector error correction arrays.

If the DUT is non-insertable the two test ports will not mate together. The simplest non-insertable case is when the connectors are of the same family and same sex—for example if both test ports are Type N(f). In this case a single calibration kit will be able to calibrate the system—the complexity of the calibration may vary depending on the desired accuracy and frequency range. Possible methods (in order of increasing accuracy) for performing calibration using connectors of the same family are the defined thru calibration method, the equal length adapters calibration method, the unknown thru calibration method (requires four channel network analyzer configuration), or the adapter removal calibration method. Each of these methods is more fully described below.

A more complicated non-insertable case occurs when the test ports are different families—for example Type N (f) and X-Band waveguide. In this case multiple calibration kits are needed (one for each family) as well as an adapter with the same port configurations as the DUT. The possible calibration methods are the unknown thru calibration method (requires four channel network analyzer) and the adapter removal calibration method. Each of these methods is more fully described below.

Electronic calibration (ecal) can be performed with ecal modules. Ecal modules can be created and characterized with any test port configuration and provide a simple user procedure for calibration—the ecal module is connected and internal switching changes the calibration states without requiring any operator interaction. This method requires separate ecal modules for each DUT test port configuration. In addition, multiple modules may be required for a given configuration depending on the desired frequency range.

The defined thru calibration method modifies the definition of the THRU standard to include the electrical length of the adapter. The adapter mismatch degrades transmission tracking and load match. This method is used with an SOLT (short, open, load, thru) calibration. The short, open, load(s) are measured at each network analyzer port. The adapter is measured as the thru standard.

The equal length adapters calibration method uses two adapters of equal length in conjunction with an SOLT calibration. One adapter is added to port 2 (or 1) that makes the thru connection insertable. After the thru is measured the added adapter is replaced with an adapter of equal length with the desired test port sex and the remaining calibration standards are connected. The second adapter that was added is left connected when the DUT is measured. Transmission tracking and load match are degraded by the difference in mismatch between the two adapters. If the adapters are similar in construction, the difference in mismatch can be less than the mismatch of a single adapter (defined thru).

The unknown thru calibration method is used with an SOLT calibration. Additional measurements possible with the 4 channel network analyzer allow the thru standard to be characterized during the calibration.

The adapter removal calibration method performs two separate two port calibrations. An adapter with the same port configurations as the DUT is used. One calibration is made with the adapter connected to port 2. The next calibration is made with the adapter connected to port 1. The appropriate error terms from both calibrations are selected and modified as needed to create the desired calibration set. This method can use any type of two-port calibration (TRL or SOLT) for each calibration. If the DUT connectors are different connector families, a separate calibration kit is required for each.

SUMMARY OF THE INVENTION

In accordance with the preferred embodiment of the present invention, effects of adapters present only during calibration of a network analyzer are removed. Scattering parameters are obtained for the adapters. For example, the scattering parameters for the adapters are obtained by characterizing the adapters. Systematic error terms for the calibration which do not include effects of the adapters are generated using the scattering parameters for the adapters.

In one embodiment of the present invention, the scattering parameters for the adapters are used to pre-load adapter error terms into the network analyzer before the calibration. The calibration is then performed with the adapter error terms pre-loaded to generate systematic error terms for the calibration.

For example, the scattering parameters ($a_{11}$, $a_{12}$, $a_{21}$, $a_{22}$, $b_{11}$, $b_{12}$, $b_{21}$ and $b_{22}$) are pre-loaded as the adapter error terms ($e_{00}$, $e_{10}e_{01}$, $e_{11}$, $e_{22}$, $e_{10}e_{32}$, $e_{33}$, $e_{23}e_{32}$, $e'_{11}$, $e'_{22}$, $e_{23}e_{01}$) as set out below:

| | |
|---|---|
| forward directivity | $e_{00} = a_{11}$; |
| forward reflection tracking | $e_{10}e_{01} = a_{21}a_{12}$; |
| forward source match | $e_{11} = a_{22}$; |
| reverse load match | $e'_{11} = a_{22}$; |
| forward transmission tracking | $e_{10}e_{32} = a_{21}b_{12}$; |
| reverse directivity | $e_{33} = b_{11}$; |
| reverse reflection tracking | $e_{23}e_{32} = b_{11}b_{12}$; |
| forward load match | $e_{22} = b_{22}$; |
| reverse source match | $e'_{22} = b_{22}$; and, |
| reverse transmission tracking | $e_{23}e_{01} = b_{21}a_{12}$. |

In an alternative embodiment of the present invention, the calibration is performed (without pre-loading adapter error terms) in order to generate preliminary systematic error terms for the calibration. The preliminary systematic error terms and the scattering parameters for the adapter are used to generate the (corrected) systematic error terms which do not include effects of the adapters.

For example, the corrected systematic error terms ($e_{00}$, $e_{10}e_{01}$, $e_{11}$, $e_{22}$, $e_{10}e_{32}$, $e_{33}$, $e_{23}e_{32}$, $e'_{11}$, $e'_{22}$, $e_{23}e_{01}$) are generated using the scattering parameters ($a_{11}$, $a_{12}$, $a_{21}$, $a_{22}$, $b_{11}$, $b_{12}$, $b_{21}$ and $b_{22}$) and the preliminary systematic error terms ($f_{00}$, $f_{10}f_{01}$, $f_{11}$, $f_{22}$, $f_{10}f_{32}$, $f_{33}$, $f_{23}f_{32}$, $f'_{11}$, $f'_{22}$, $f_{23}f_{01}$) as set out below:

forward directivity:

$$e_{00} = f_{00} + \frac{f_{10}f_{01}}{a_{11}a_{22} - a_{12}a_{21} - a_{11}f_{11}};$$

forward reflection tracking:

$$e_{10}e_{01} = \frac{a_{21}a_{12}f_{10}f_{01}}{(a_{11}a_{22} - a_{12}a_{21} - a_{11}f_{11})^2};$$

forward source match:

$$e_{11} = \frac{a_{22} - f_{11}}{a_{11}a_{22} - a_{12}a_{21} - a_{11}f_{11}};$$

forward load match:

$$e_{22} = \frac{b_{22} - f_{22}}{b_{11}b_{22} - b_{12}b_{21} - a_{22}f_{22}};$$

forward transmission tracking:

$$e_{10}e_{32} = \frac{a_{12}b_{21}f_{10}f_{32}}{(a_{11}a_{22} - a_{12}a_{21} - a_{11}f_{11})(b_{11}b_{22} - b_{12}b_{21} - a_{22}f_{22})};$$

reverse directivity:

$$e_{33} = f_{33} + \frac{f_{32}f_{23}}{b_{11}b_{22} - b_{12}b_{21} - b_{11}f_{22}};$$

reverse reflection tracking:

$$e_{23}e_{32} = \frac{b_{12}b_{21}f_{23}f_{32}}{(b_{11}b_{22} - b_{12}b_{21} - a_{22}f_{22})^2};$$

reverse load match:

$$e'_{11} = \frac{a_{22} - f'_{11}}{a_{11}a_{22} - a_{12}a_{21} - a_{11}f'_{11}};$$

reverse source match:

$$e'_{22} = \frac{b_{22} - f'_{22}}{b_{11}b_{22} - b_{12}b_{21} - a_{22}f'_{22}}; \quad \text{and,}$$

reverse transmission tracking:

$$e_{23}e_{01} = \frac{a_{21}b_{12}f_{01}f_{23}}{(b_{11}b_{22} - b_{12}b_{21} - a_{22}f_{22})(a_{11}a_{22} - a_{12}a_{21} - a_{11}f_{11})}.$$

The present invention utilizes characterized adapters which facilitates the use of separate calibration and measurement interfaces. With this invention, a single calibration kit (or ecal module) plus characterized adapters is all that is needed to support multiple device under test (DUT) connector fixtures. The accuracy (relative to an insertable calibration) is degraded only by the level of adapter characterization. The calibration simplicity is the same as an inertable calibration.

DESCRIPTION OF THE PREFERRED EMBODIMENT

Figure 1:
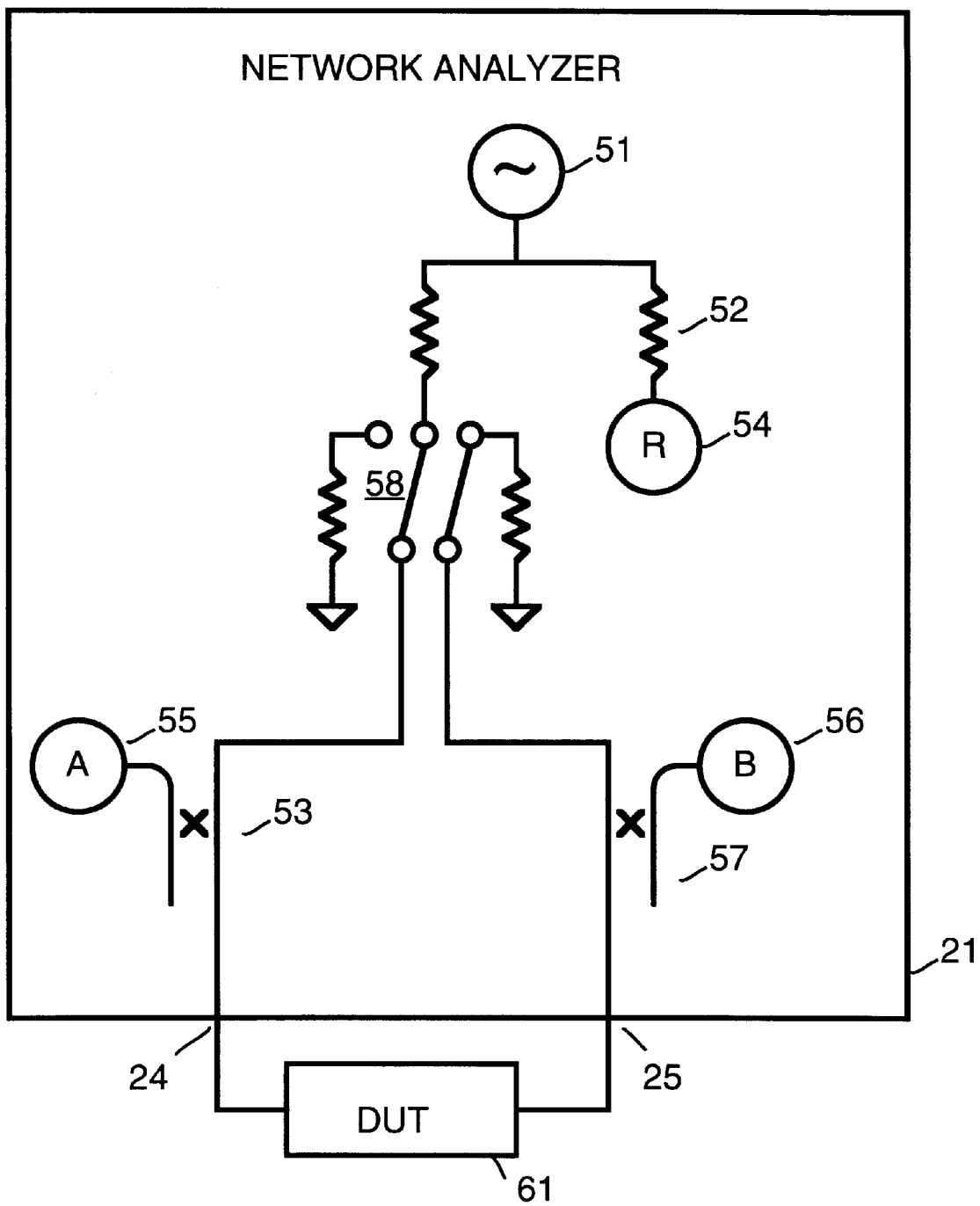
FIG. 1 is a simplified block diagram of a radio frequency network analyzer in accordance with the prior art.

FIG. 1 is a simplified block diagram of a radio frequency network analyzer 21 connected to a device under test (DUT) 61. A radio frequency source 51 provides a radio frequency out signal placed on a radio frequency (RF) out port 24 or port 25 depending on a position of an RF switch 58. The radio frequency out signal is also coupled to a reference signal line 52 and detected by an incident detector 54 to provide a measurement of the incident signal. RF switch 58 directs the RF signal to either port 24 or port 25. When RF switch 58 directs the RF signal to port 24 the forward s-parameters are measured. With RF switch 58 directing the RF signal to port 24 any signal reflected from port 24 will be coupled to a signal line 53 and detected by a reflection/ transmission detector 55 to provide an measurement of the reflected signal. The transmitted signal received into port 25 is coupled to signal line 57 and detected by transmission/ reflection detector 56 to provide a measure of the transmitted signal. When RF switch 58 directs the signal to port 25 the reverse s-parameters can be measured. With RF switch 58 directing the signal to port 25 the reflected signal is coupled to the signal line 57 and detected by transmission/reflection detector 56. The transmitted signal is coupled to the signal line 53 and detected by reflection/transmission detector 55.

Figure 2:
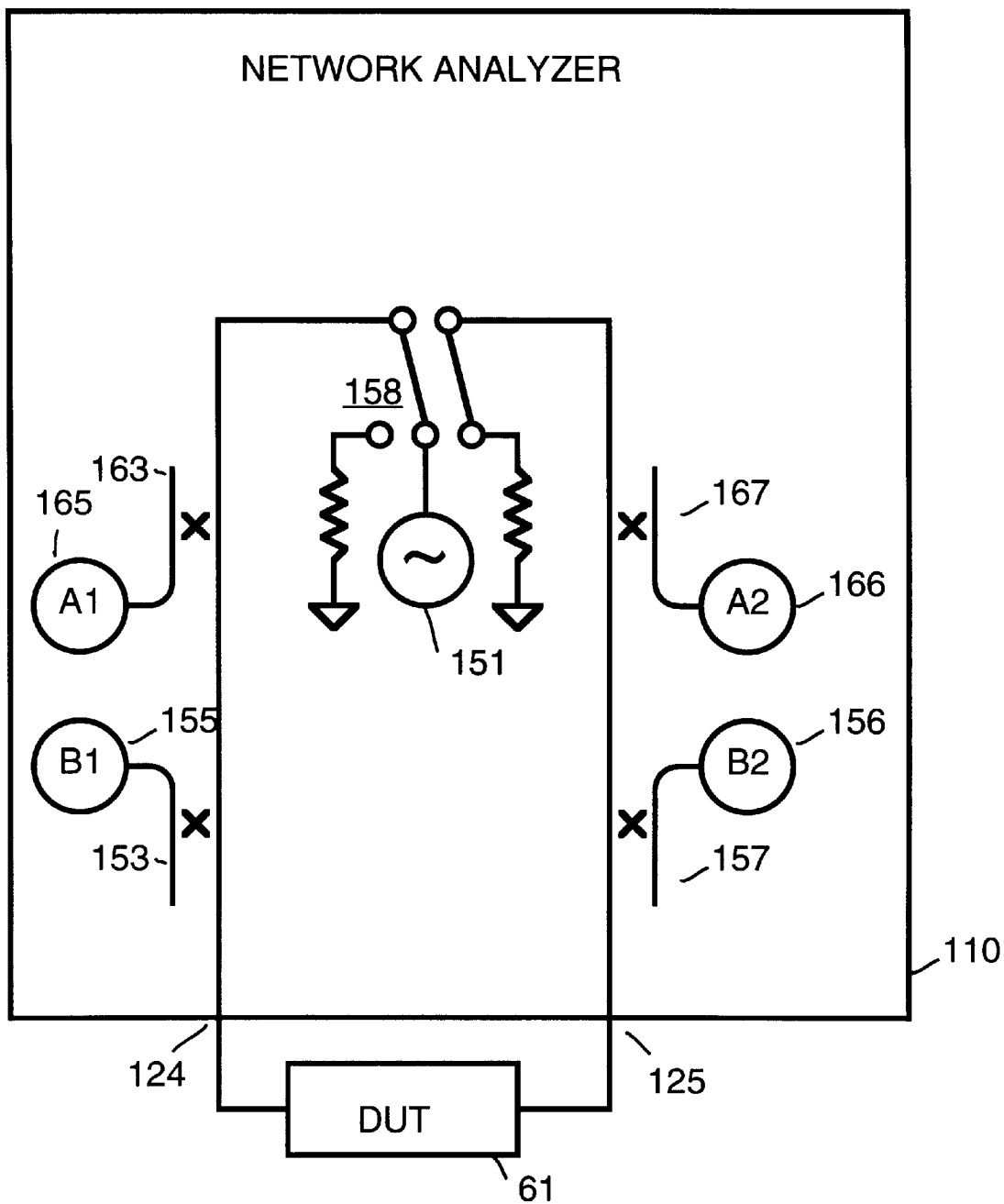
FIG. 2 is another simplified block diagram of a radio frequency network analyzer in accordance with the prior art.

A network analyzer 110 shown in FIG. 2 is similar to network analyzer 21 shown in FIG. 1 with the exception that an RF switch 158 is placed before the incident signal detector. Having RF switch 158 before the incident signal detector requires a separate incident signal detector for each port. Specifically, a radio frequency source 151 provides a radio frequency out signal placed on a radio frequency (RF) out port 124 or port 125 depending on a position of RF switch 158. RF switch 158 directs the RF signal to either port 124 or port 125. When switch 158 connects radio frequency source 151 to port 124, the radio frequency out signal is also coupled to a reference signal line 163 and detected by an incident detector 165 to provide a measurement of the incident signal for port 124. When switch 158 connects radio frequency source 151 to port 125, the radio frequency out signal is coupled to a reference signal line 167 and detected by an incident detector 166 to provide a measurement of the incident signal for port 125. When RF switch 158 directs the RF signal to port 124 the forward s-parameters are measured. With RF switch 158 directing the RF signal to port 124 any signal reflected from port 124 will be coupled to a reflected signal line 153 and detected by a reflection/transmission detector 155 to provide an measurement of the reflected signal. The transmitted signal received into port 125 is coupled to signal line 157 and detected by transmission/reflection detector 156 to provide a measure of the transmitted signal. When RF switch 158 directs the signal to port 125 the reverse s-parameters can be measured. With RF switch 158 directing the signal to port 125 the reflected signal is coupled to the signal line 157 and detected by transmission/reflection detector 156. The transmitted signal is coupled to the signal line 153 and detected by reflection/transmission detector 155.

Figure 3:
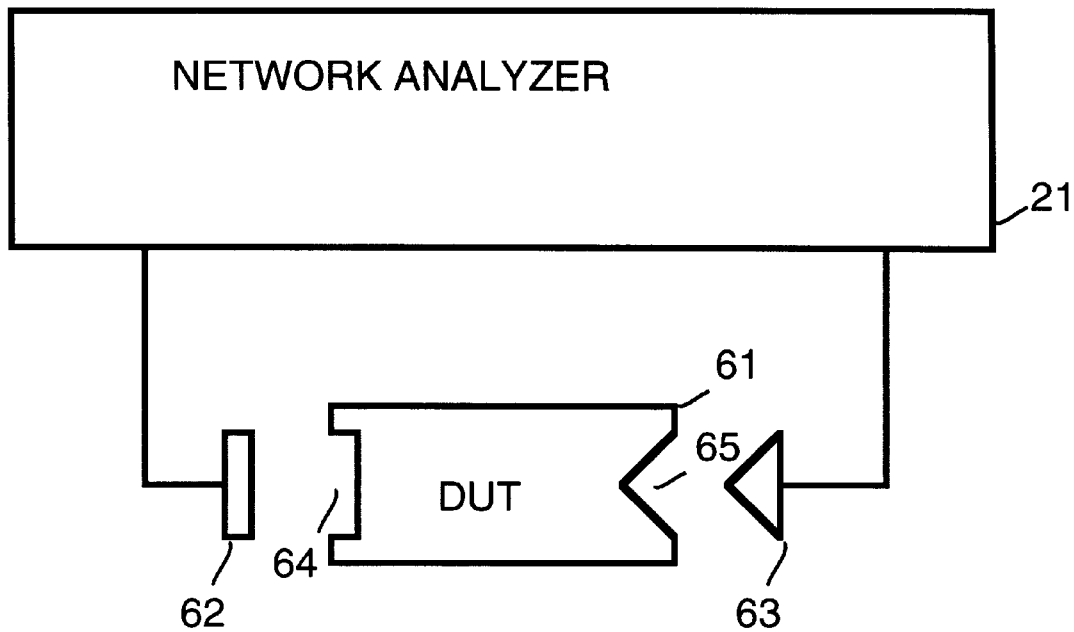
FIG. 3 is a simplified block diagram which illustrate different measurement interfaces to a device under test (DUT) in accordance with the prior art.
Figure 4:
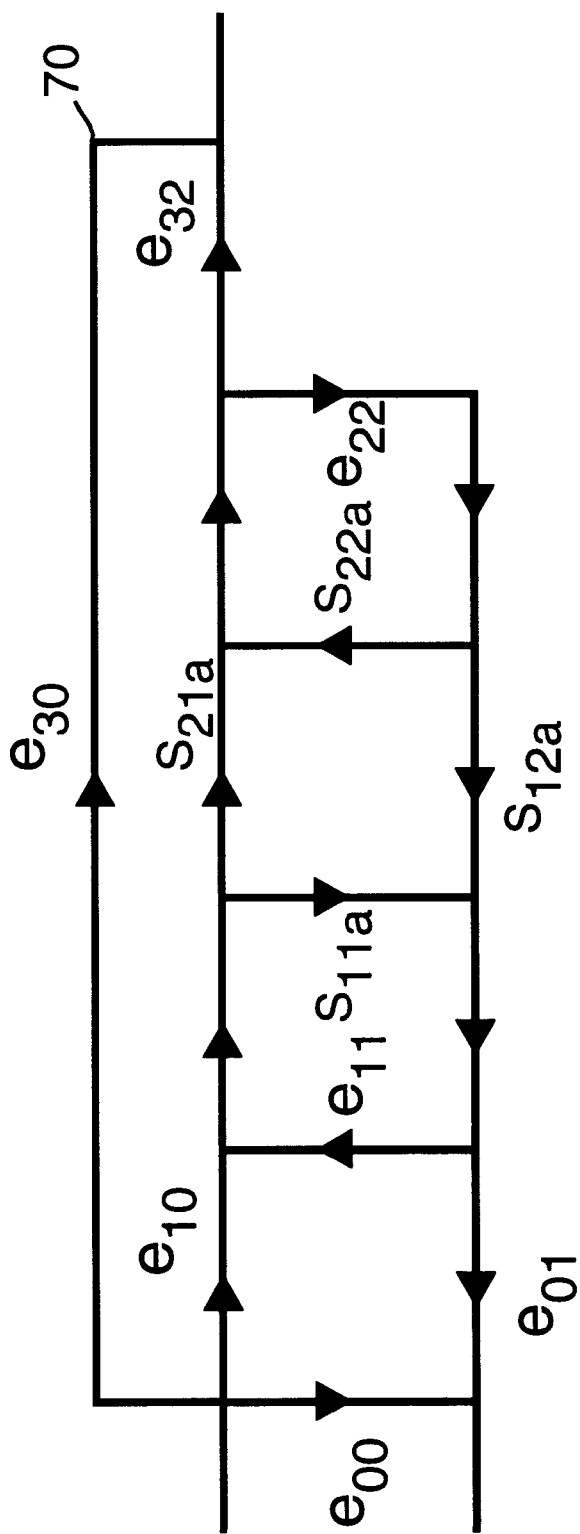
FIG. 4, FIG. 5 and FIG. 6 illustrate a network analyzer error term model in accordance with the prior art.
Figure 5:
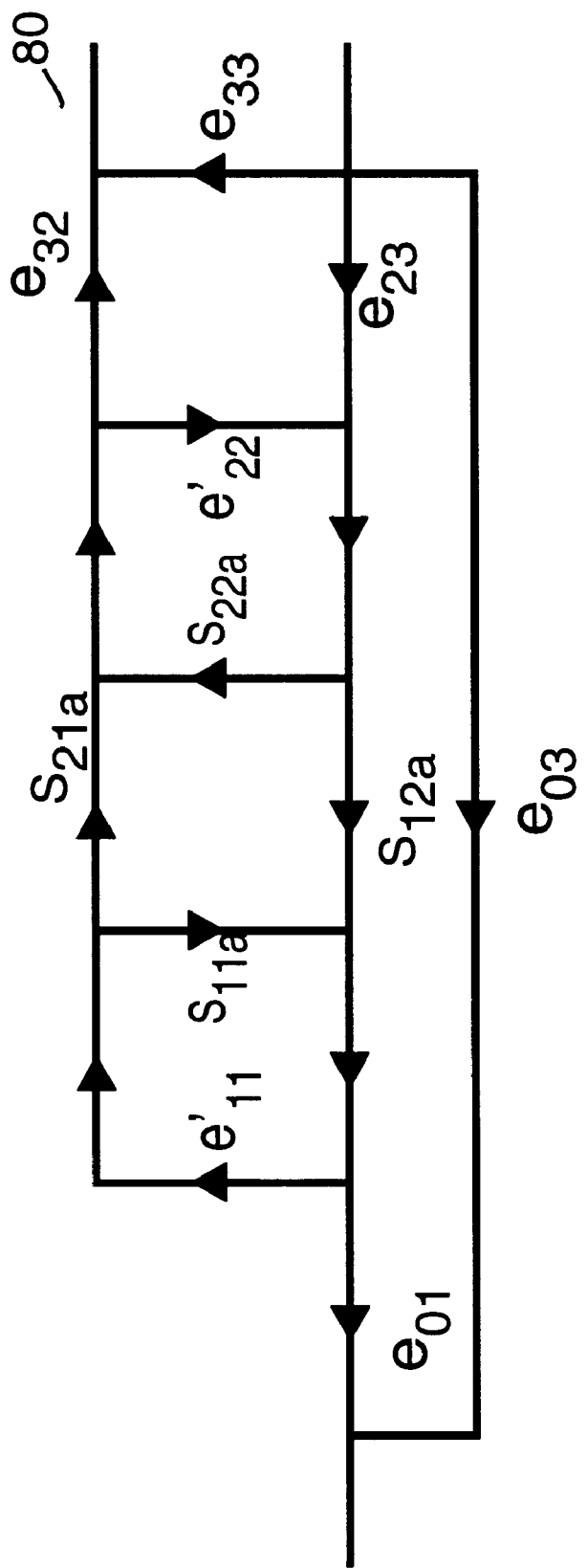
Figure 6:
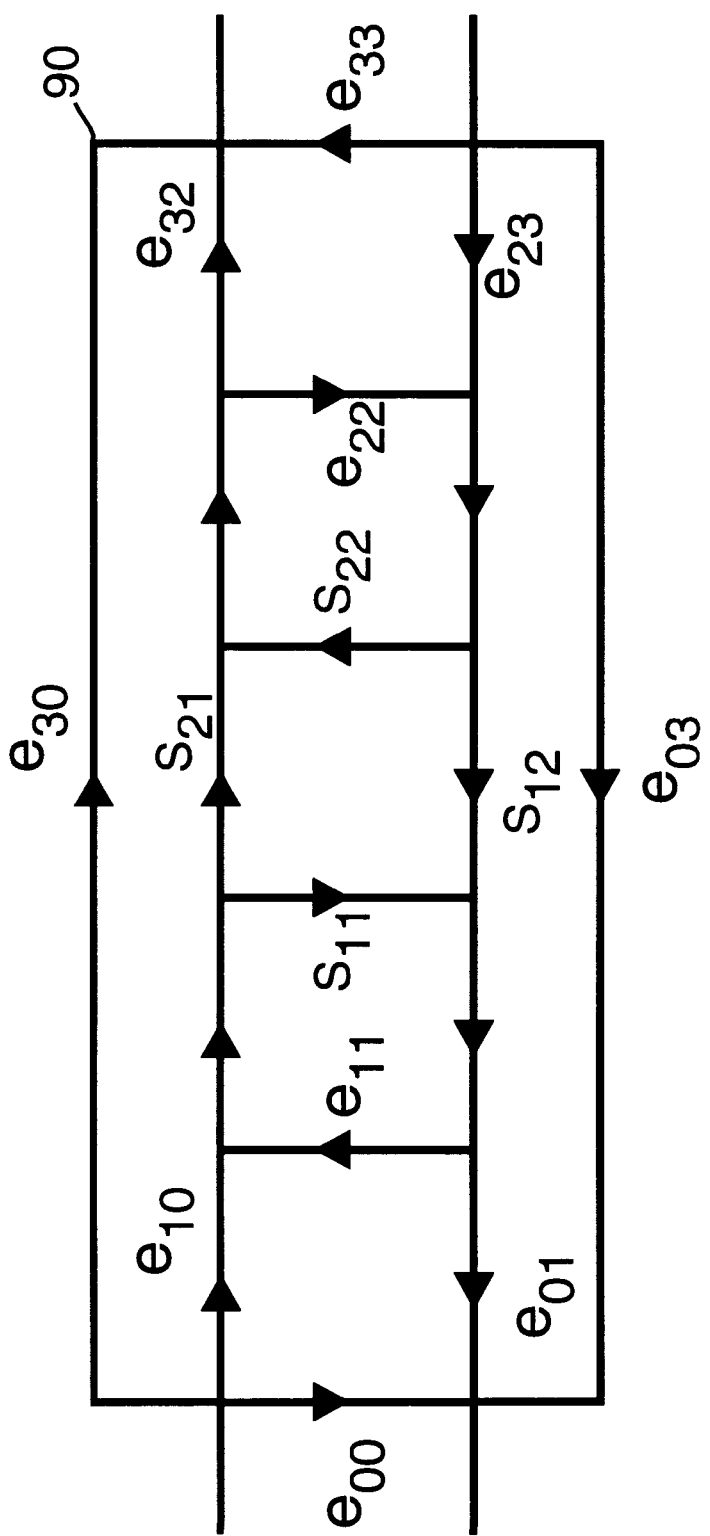

FIG. 3 shows an arrangement by which network analyzer 21 tests DUT 61. DUT 61 includes a measurement interface 64 which receives a connector 62. DUT 61 also includes a measurement interface 65 which receives a connector 63.

In the preferred embodiment of the present invention, in order to limit the number of calibration kits which are required to perform calibration of network analyzer 21, calibrated adapters are used. Each calibration adapter contains a measurement interface for receiving a particular connector type, and a calibration interface for connection to a calibration kit (or electronic calibration module). This allows a single calibration kit to be used to calibration regardless of the types of connectors used by the DUT.

Figure 7:
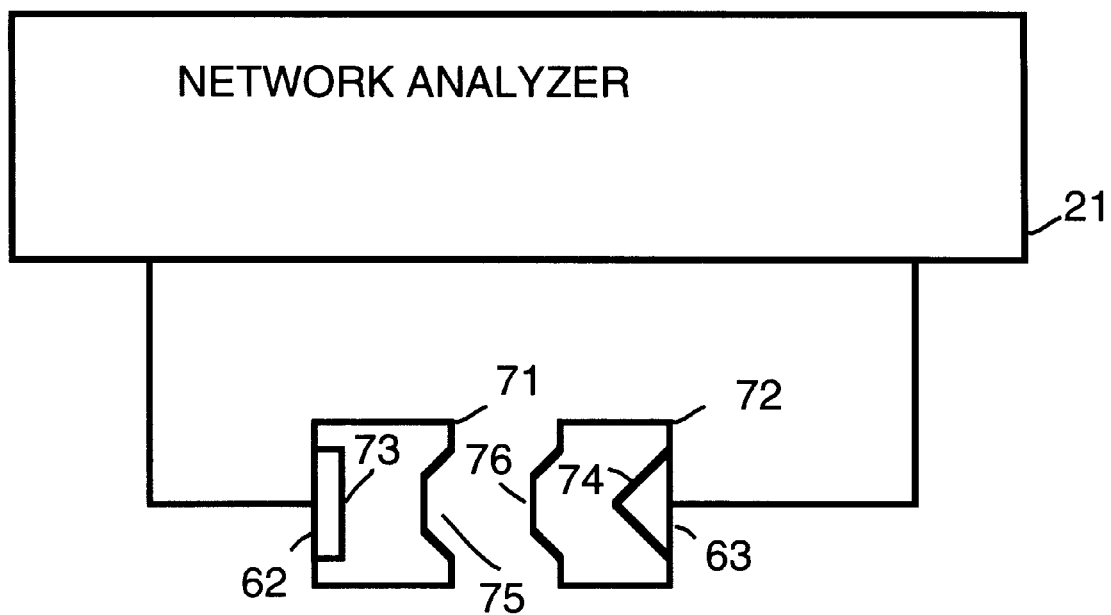
FIG. 7 is a simplified block diagram which illustrates use of characterized adapters for calibration in accordance with a preferred embodiment of the present invention.

For example, FIG. 7 shows an adapter 71 which has a measurement interface 73 for receiving connector 62. Adapter 71 also has a calibration interface 75 for connection to a calibration kit (or electronic calibration module). An adapter 72 has a measurement interface 74 for receiving connector 63. Adapter 72 also has a calibration interface 76 for connection to a calibration kit (or electronic calibration module), or for connection through to adapter 71.

Figure 8:
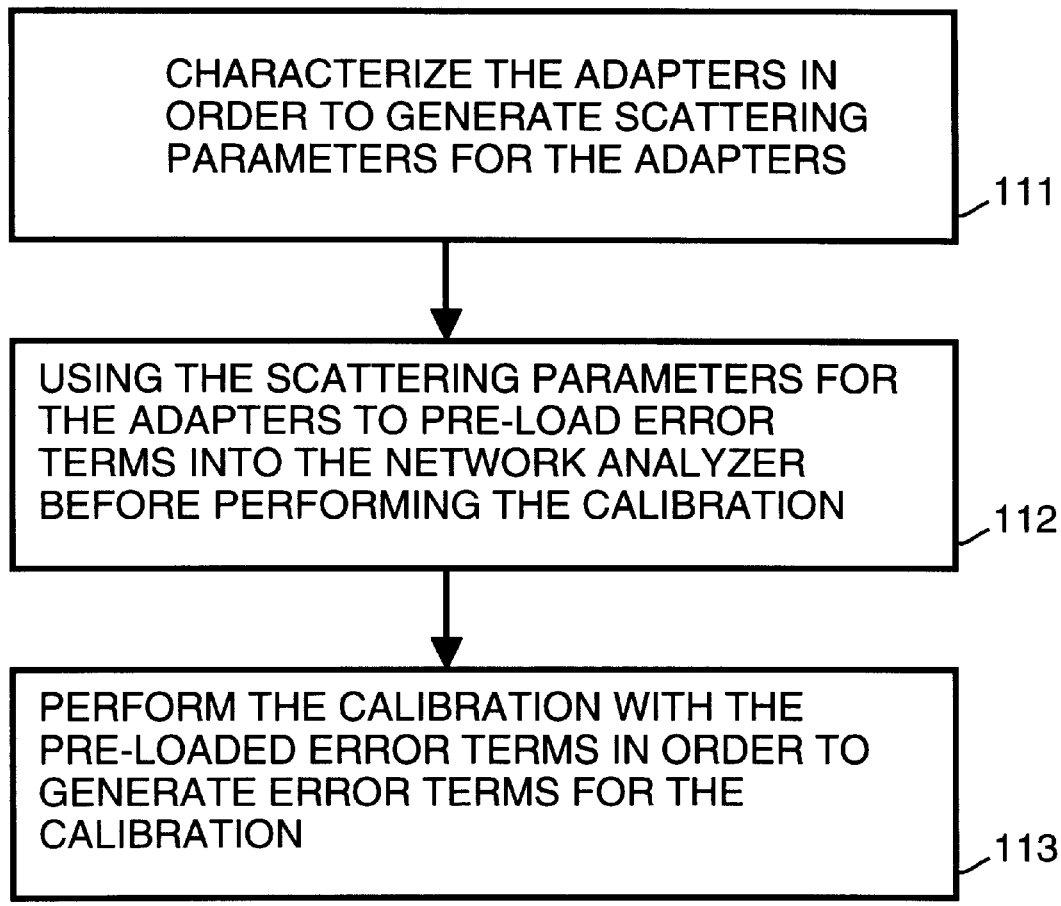
FIG. 8 is a simplified flowchart which illustrates generation of error terms for a system in which characterized adapters are used for calibration in accordance with a preferred embodiment of the present invention.

FIG. 8 is a simplified flowchart which illustrates generation of systematic error terms for a system in which characterized adapters are used for calibration in accordance with an embodiment of the present invention.

Figure 9:
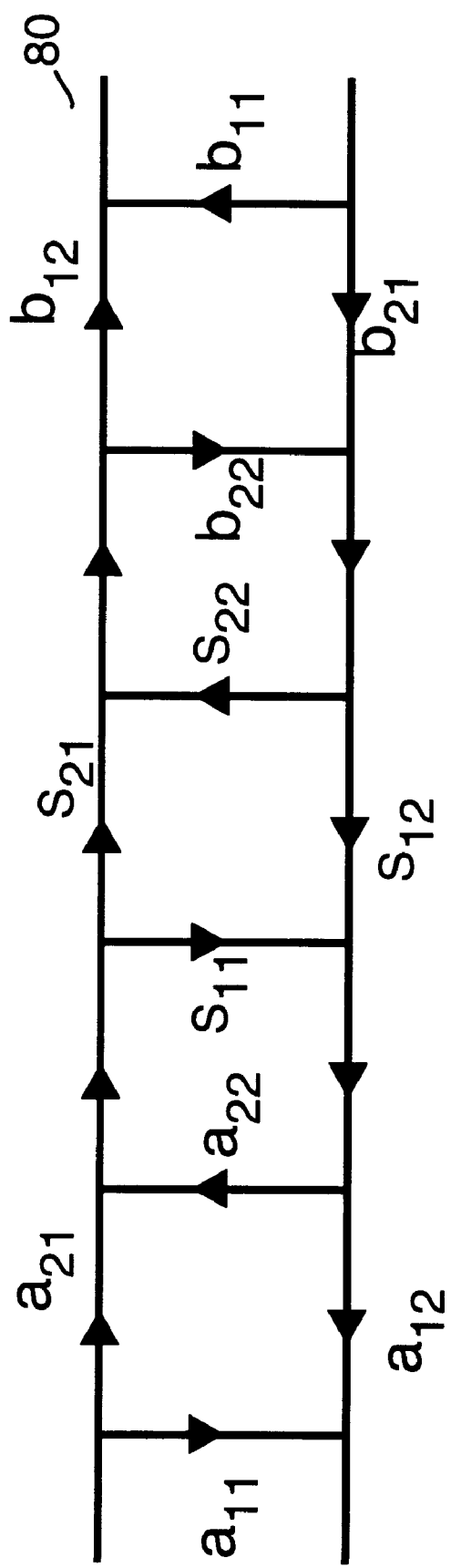
FIG. 9 is a flowgraph which represents a network analyzer system with adapters connected to both test ports during calibration.

In a step 111, the adapters are characterized in order to generate scattering parameters for the adapters. This is illustrated by FIG. 9. FIG. 9 is a flowgraph which represents a network analyzer system with adapters connected to both test ports during calibration. The scattering parameters for the adapters include the scattering parameters, $a_{11}$, $a_{12}$, $a_{21}$, $a_{22}$, $b_{11}$, $b_{12}$, $b_{21}$ and $b_{22}$. This step may be performed, for example, by the manufacturer and the values for scattering parameters made available to the end user. Thus the end-user can obtain the scattering parameters for the adapters merely by referencing the scattering parameters already generated.

In a step 112, the scattering parameters for the adapters are used to pre-load adapter error terms into the network analyzer before performing the calibration. The scattering parameters for the adapters are pre-loaded as adapter error terms ($e_{00}$, $e_{10}e_{01}$, $e_{11}$, $e_{22}$, $e_{10}e_{32}$, $e_{33}$, $e_{23}e_{32}$, $e'_{11}$, $e'_{22}$, $e_{23}e_{01}$) into the network analyzer in accordance with Table 1 below:

TABLE 1

| | |
|---|---|
| Forward directivity | $e_{00} = a_{11}$ |
| Forward reflection tracking | $e_{10}e_{01} = a_{21}a_{12}$ |
| Forward source match | $e_{11} = a_{22}$ |
| Reverse load match | $e'_{11} = a_{22}$ |
| Forward transmission tracking | $e_{10}e_{32} = a_{21}b_{12}$ |
| Reverse directivity | $e_{33} = b_{11}$ |
| Reverse reflection tracking | $e_{23}e_{32} = b_{21}b_{12}$ |
| Forward load match | $e_{22} = b_{22}$ |
| Reverse source match | $e'_{22} = b_{22}$ |
| Reverse transmission tracking | $e_{23}e_{01} = b_{21}a_{12}$ |

In the above steps the adapters are assumed to be ideal, so the cross talk terms ($e_{30}$, $e_{03}$) are not pre-loaded.

In a step 113, the calibration is performed with the pre-loaded adapter error terms in order to generate systematic error terms for the calibration. In essence, the calibration gathers corrected data rather than raw data of the calibration standards. The corrected data takes into account the effects of the adapters by changing the reference plane to the test port connectors without the presence of the adapters. The corrected data (corrected to remove the effects of the adapters) are then used for computing the (corrected) systematic error terms.

Figure 10:
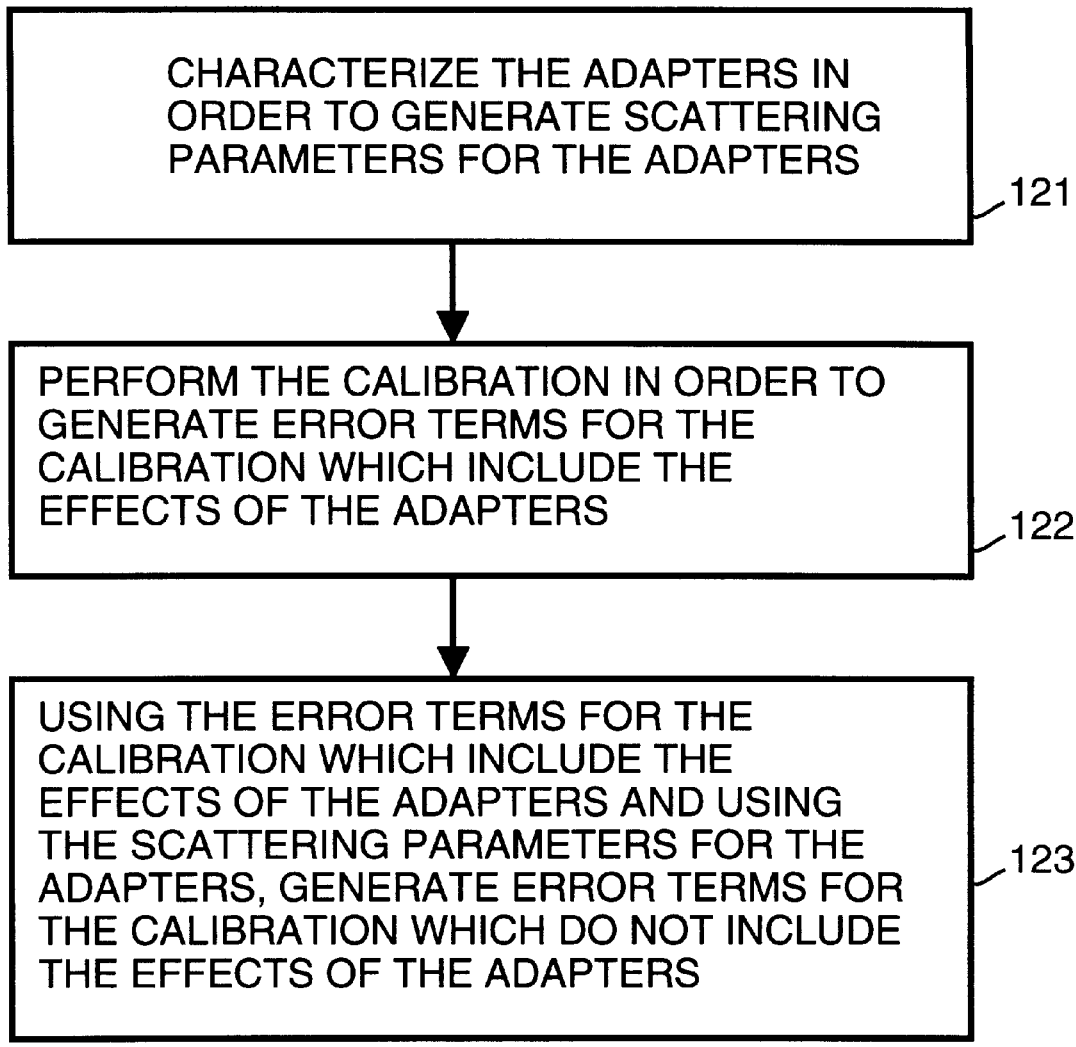
FIG. 10 is a simplified flowchart which illustrates generation of error terms for a system in which characterized adapters are used for calibration in accordance with an alternative preferred embodiment of the present invention.

FIG. 10 is a simplified flowchart which illustrates generation of systematic error terms for a system in which characterized adapters are used for calibration in accordance with an alternative preferred embodiment of the present invention.

In a step 121, the adapters are characterized in order to generate scattering parameters for the adapters. This is illustrated by FIG. 9. FIG. 9 is a flowgraph which represents a network analyzer system with adapters connected to both test ports during calibration. The scattering parameters for the adapters include the scattering parameters, $a_{11}$, $a_{12}$, $a_{21}$, $a_{22}$, $b_{11}$, $b_{12}$, $b_{21}$ and $b_{22}$. This step may be performed, for example, by the manufacturer and the values for scattering parameters made available to the end user. Thus the end-user can obtain the scattering parameters for the adapters merely by referencing the scattering parameters already generated.

In a step 122, the calibration is performed. This is done without pre-loaded adapter error terms. That is, the calibration gathers data which includes the effects of the adapters. This calibration yields preliminary systematic error terms.

In a step 123, using the preliminary systematic error terms for the calibration which include the effects of the adapters and using the scattering parameters for the adapters, corrected systematic error terms for the calibration are generated. The corrected systematic error terms do not include the effects of the adapters. The corrected systematic error terms are thus de-embedded from the scattering parameters for the adapters.

Figure 11:
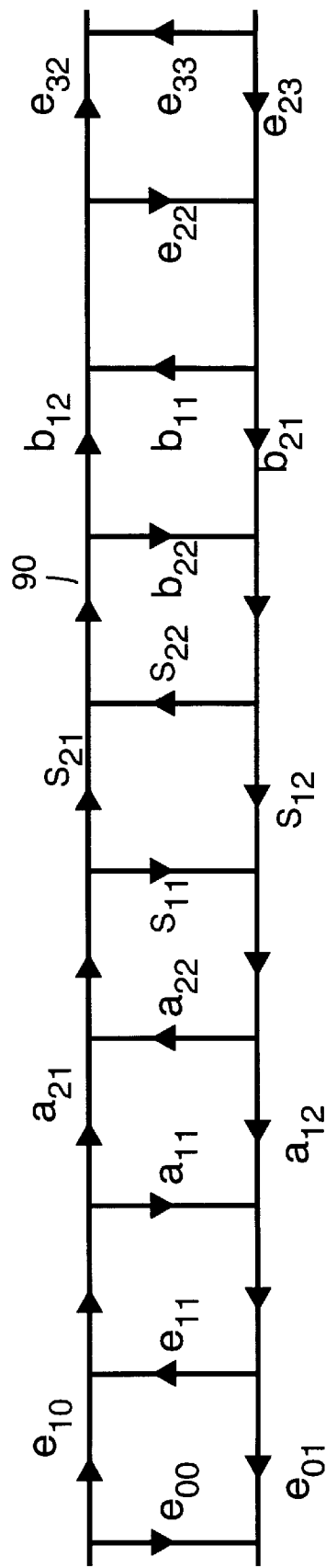
FIG. 11 is a flowgraph which shows error terms and adapter s-parameters listed separately.
Figure 12:
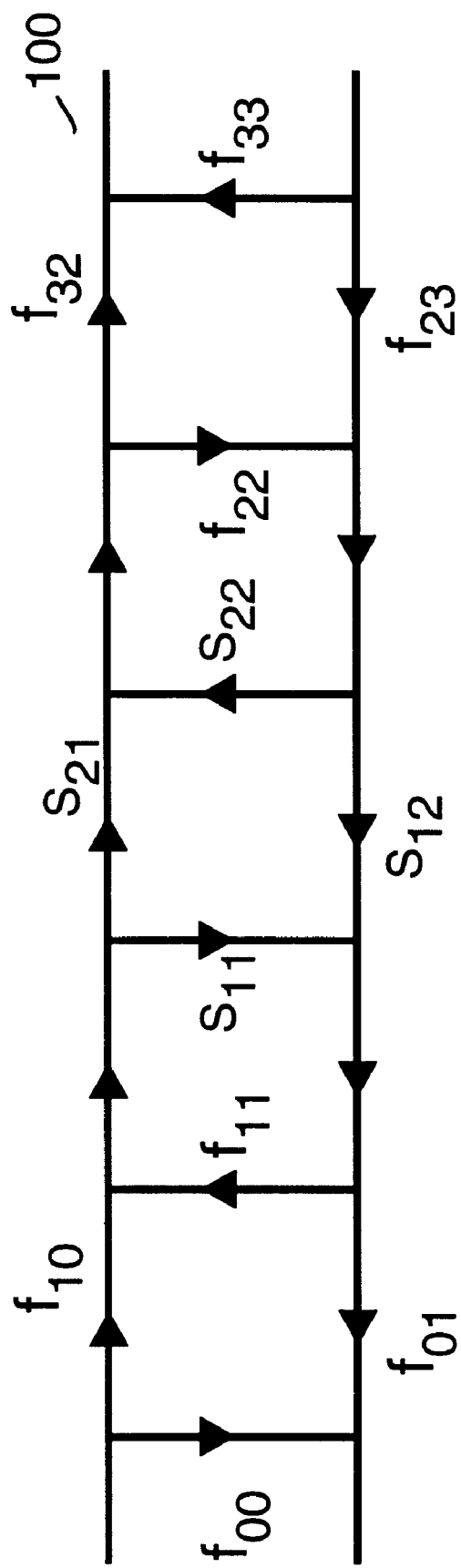
FIG. 12 is a flowgraph which shows error terms computed by error correction routines (using raw data), in accordance with a preferred embodiment of the present invention.

This is illustrated by FIG. 11 and FIG. 12. FIG. 11 is a flowgraph which show the elements ($e_{00}$, $e_{11}$, $e_{10}$, $e_{01}$, $e_{33}$, $e_{22}$, $e_{23}$, $e_{32}$) needed to compute corrected systematic error terms ($e_{00}$, $e_{10}e_{01}$, $e_{11}$, $e_{22}$, $e_{10}e_{32}$, $e_{33}$, $e_{23}e_{32}$, $e'_{11}$, $e'_{22}$, $e_{23}e_{01}$) and the adapter scattering parameters ($a_{11}$, $a_{12}$, $a_{21}$, $a_{22}$, $b_{11}$, $b_{12}$, $b_{21}$ and $b_{22}$) separately.

FIG. 12 is a flowgraph which show the preliminary systematic error term elements ($f_{00}$, $f_{11}$, $f_{10}$, $f_{01}$, $f_{33}$, $f_{22}$, $f_{23}$, $f_{32}$) as computed in step 122 by the error correction routines (using the raw data).

Thus the corrected systematic error terms ($e_{00}$, $e_{10}e_{01}$, $e_{11}$, $e_{22}$, $e_{10}e_{32}$, $e_{33}$, $e_{23}e_{32}$, $e'_{11}$, $e'_{22}$, $e_{23}e_{01}$) can be calculated from the preliminary systematic error terms ($f_{00}$, $f_{10}e_{01}$, $f_{11}$, $f_{22}$, $f_{10}f_{32}$, $f_{33}$, $f_{23}f_{32}$, $f_{11}$, $f_{22}$, $f_{23}f_{01}$) and the adapter scattering parameters ($a_{11}$, $a_{12}$, $a_{21}$, $a_{22}$, $b_{11}$, $b_{12}$, $b_{21}$ and $b_{22}$) as set out by the equations in Table 2 below:

TABLE 2

$$e_{00} = f_{00} + \frac{a_{11}f_{10}f_{01}}{a_{11}a_{22} - a_{12}a_{21} - a_{11}f_{11}}$$

$$e_{10} = \frac{a_{12}f_{10}}{a_{11}a_{22} - a_{12}a_{21} - a_{11}f_{11}}$$

$$e_{01} = \frac{a_{21}f_{01}}{a_{11}a_{22} - a_{12}a_{21} - a_{11}f_{11}}$$

$$e_{11} = \frac{a_{22} - f_{11}}{a_{11}a_{22} - a_{12}a_{21} - a_{11}f_{11}}$$

$$e_{33} = f_{33} + \frac{b_{11}f_{32}f_{23}}{b_{11}b_{22} - b_{12}b_{21} - b_{11}f_{22}}$$

$$e_{23} = \frac{b_{12}f_{23}}{b_{11}b_{22} - b_{12}b_{21} - a_{22}f_{22}}$$

$$e_{32} = \frac{b_{21}f_{32}}{b_{11}b_{22} - b_{12}b_{21} - a_{22}f_{22}}$$

$$e_{22} = \frac{b_{22} - f_{22}}{b_{11}b_{22} - b_{12}b_{21} - a_{22}f_{22}}$$

Based on the calculation for the corrected systematic error terms shown in Table 2 above, forward directivity ($e_{00}$), forward reflection tracking ($e_{10}e_{01}$), forward source match ($e_{11}$), reverse load match ($e'_{11}$), forward transmission tracking ($e_{10}e_{32}$), reverse directivity ($e_{33}$), reverse reflection tracking ($e_{23}e_{32}$), forward load match ($e_{22}$), reverse source match ($e'_{22}$), and reverse transmission tracking ($e_{23}e_{01}$), are calculated as set out by the equations in Table 3 below:

TABLE 3

Forward directivity:
$$e_{00} = f_{00} + \frac{a_{11}f_{10}f_{01}}{a_{11}a_{22} - a_{12}a_{21} - a_{11}f_{11}}$$

Forward reflection tracking:
$$e_{10}e_{01} = \frac{a_{21}a_{12}f_{10}f_{01}}{(a_{11}a_{22} - a_{12}a_{21} - a_{11}f_{11})^2}$$

Forward source match:
$$e_{11} = \frac{a_{22} - f_{11}}{a_{11}a_{22} - a_{12}a_{21} - a_{11}f_{11}}$$

Forward load match:
$$e_{22} = \frac{b_{22} - f_{22}}{b_{11}b_{22} - b_{12}b_{21} - a_{22}f_{22}}$$

Forward transmission tracking:
$$e_{10}e_{32} = \frac{a_{12}b_{21}f_{10}f_{32}}{(a_{11}a_{22} - a_{12}a_{21} - a_{11}f_{11})(b_{11}b_{22} - b_{12}b_{21} - a_{22}f_{22})}$$

Reverse directivity:
$$e_{33} = f_{33} + \frac{b_{11}f_{32}f_{23}}{b_{11}b_{22} - b_{12}b_{21} - b_{11}f_{22}}$$

Reverse reflection tracking:
$$e_{23}e_{32} = \frac{b_{12}b_{21}b_{23}f_{32}}{(b_{11}b_{22} - b_{12}b_{21} - a_{22}f_{22})^2}$$

Reverse load match:
$$e'_{11} = \frac{a_{22} - f'_{11}}{a_{11}a_{22} - a_{12}a_{21} - a_{11}f'_{11}}$$

TABLE 3-continued

Reverse source match:

$$e'_{22} = \frac{b_{22} - f'_{22}}{b_{11}b_{22} - b_{12}b_{21} - a_{22}f'_{22}}$$

Reverse transmission tracking:

$$e_{23}e_{01} = \frac{a_{21}b_{12}f_{01}f_{23}}{(b_{11}b_{22} - b_{12}b_{21} - a_{22}f_{22})(a_{11}a_{22} - a_{12}a_{21} - a_{11}f_{11})}$$

In the above steps the adapters are assumed to be ideal, so the cross talk terms ($e_{30}$, $e_{03}$) are not changed.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method for removing effects of adapters present during calibration of a network analyzer, comprising the following steps:
   (a) obtaining scattering parameters for the adapters;
   (b) using the scattering parameters for the adapters to pre-load adapter error terms into the network analyzer before the calibration; and,
   (c) performing the calibration with the adapter error terms, pre-loaded in step (b), in order to generate systematic error terms which are exclusive of the effects of the adapters.

2. A method as in claim 1 wherein in step (a) the scattering parameters for the adapters are obtained by characterizing the adapters to generate the scattering parameters.

3. A method as in claim 1 wherein in step (b) the scattering parameters ($a_{11}$, $a_{12}$, $a_{21}$, $a_{22}$, $b_{11}$, $b_{12}$, $b_{21}$ and $b_{22}$) are pre-loaded as the adapter error terms ($e_{00}$, $e_{10}e_{01}$, $e_{11}$, $e_{22}$, $e_{10}e_{32}$, $e_{33}$, $e_{23}e_{32}$, $e'_{11}$, $e'_{22}$, $e_{23}e_{01}$) as set out below:

| | |
|---|---|
| forward directivity | $e_{00} = a_{11}$; |
| forward reflection tracking | $e_{10}e_{01} = a_{21}a_{12}$; |
| forward source match | $e_{11} = a_{22}$; |
| forward load match | $e_{22} = b_{22}$; |
| forward transmission tracking | $e_{10}e_{32} = a_{21}b_{12}$; |
| reverse directivity | $e_{33} = b_{11}$; |
| reverse reflection tracking | $e_{23}e_{32} = b_{21}b_{12}$; |
| reverse load match | $e'_{11} = a_{22}$; |
| reverse source match | $e'_{22} = b_{22}$; and, |
| reverse transmission tracking | $e_{23}e_{01} = b_{21}a_{12}$. |

4. A method for removing effects of adapters present during calibration of a network analyzer, comprising the following steps:
   (a) obtaining scattering parameters for the adapters;
   (b) performing the calibration in order to generate preliminary systematic error terms for the calibration; and,
   (c) using the preliminary systematic error terms generated in step (b) and the scattering parameters for the adapter obtained in step (a) in order to generate corrected systematic error terms which do not include effects of the adapters.

5. A method as in claim 4 wherein in step (a) the scattering parameters for the adapters are obtained by characterizing the adapters to generate the scattering parameters.

6. A method as in claim 4 wherein in step (c) the corrected systematic error terms ($e_{00}$, $e_{10}e_{01}$, $e_{11}$, $e_{22}$, $e_{10}e_{32}$, $e_{33}$, $e_{23}e_{32}$, $e'_{11}$, $e'_{22}$, $e_{23}e_{01}$) are generated using the scattering parameters ($a_{11}$, $a_{12}$, $a_{21}$, $a_{22}$, $b_{11}$, $b_{12}$, $b_{21}$ and $b_{22}$) and the preliminary systematic error terms ($f_{00}$, $f_{10}f_{01}$, $f_{11}$, $f_{22}$, $f_{10}f_{32}$, $f_{33}$, $f_{23}f_{32}$, $f'_{11}$, $f'_{22}$, $f_{23}f_{01}$) as set out below:

forward directivity:

$$e_{00} = f_{00} + \frac{a_{11}f_{10}f_{01}}{a_{11}a_{22} - a_{12}a_{21} - a_{11}f_{11}};$$

forward reflection tracking:

$$e_{10}e_{01} = \frac{a_{21}a_{12}f_{10}f_{01}}{(a_{11}a_{22} - a_{12}a_{21} - a_{11}f_{11})^2};$$

forward source match:

$$e_{11} = \frac{a_{22} - f_{11}}{a_{11}a_{22} - a_{12}a_{21} - a_{11}f_{11}};$$

forward load match:

$$e_{22} = \frac{b_{22} - f_{22}}{b_{11}b_{22} - b_{12}b_{21} - a_{22}f_{22}};$$

forward transmission tracking:

$$e_{10}e_{32} = \frac{a_{12}b_{21}f_{10}f_{32}}{(a_{11}a_{22} - a_{12}a_{21} - a_{11}f_{11})(b_{11}b_{22} - b_{12}b_{21} - a_{22}f_{22})};$$

reverse directivity:

$$e_{33} = f_{33} + \frac{b_{11}f_{32}f_{23}}{b_{11}b_{22} - b_{12}b_{21} - b_{11}f_{22}};$$

reverse reflection tracking:

$$e_{23}e_{32} = \frac{b_{12}b_{21}f_{23}f_{32}}{(b_{11}b_{22} - b_{12}b_{21} - a_{22}f_{22})^2};$$

reverse load match:

$$e'_{11} = \frac{a_{22} - f'_{11}}{a_{11}a_{22} - a_{12}a_{21} - a_{11}f'_{11}};$$

reverse source match:

$$e'_{22} = \frac{b_{22} - f'_{22}}{b_{11}b_{22} - b_{12}b_{21} - a_{22}f'_{22}}; \quad \text{and,}$$

reverse transmission tracking:

$$e_{23}e_{01} = \frac{a_{21}b_{12}f_{01}f_{23}}{(b_{11}b_{22} - b_{12}b_{21} - a_{22}f_{22})(a_{11}a_{22} - a_{12}a_{21} - a_{11}f_{11})}.$$

7. A method for removing effects of adapters present during calibration of a network analyzer, comprising the following steps:
   (a) obtaining scattering parameters for the adapters; and,
   (b) using the scattering parameters for the adapters to generate systematic error terms for the calibration which do not take into account effects of the adapters.

8. A method as in claim 7 wherein step (b) comprises the following substeps:
   (b.1) using the scattering parameters for the adapters to pre-load adapter error terms into the network analyzer before the calibration; and,
   (b.2) performing the calibration with the adapter error terms pre-loaded in substep (b.1), in order to generate the systematic error terms for the calibration.

9. A method as in claim 8 wherein in step (a) the scattering parameters for the adapters are obtained by characterizing the adapters to generate the scattering parameters.

10. A method as in claim 8 wherein in substep (b.1) the scattering parameters ($a_{11}$, $a_{12}$, $a_{21}$, $a_{22}$, $b_{11}$, $b_{12}$, $b_{21}$ and $b_{22}$) are pre-loaded as the adapter error terms ($e_{00}$, $e_{10}e_{01}$, $e_{11}$, $e_{22}$, $e_{10}e_{32}$, $e_{33}$, $e_{23}e_{32}$, $e'_{11}$, $e'_{22}$, $e_{23}e_{01}$) as set out below:

| | |
|---|---|
| forward directivity | $e_{00} = a_{11}$; |
| forward reflection tracking | $e_{10}e_{01} = a_{21}a_{12}$; |
| forward source match | $e_{11} = a_{22}$; |
| forward load match | $e_{22} = b_{22}$; |
| forward transmission tracking | $e_{10}e_{32} = a_{21}b_{12}$; |
| reverse directivity | $e_{33} = b_{11}$; |
| reverse reflection tracking | $e_{23}e_{32} = b_{21}b_{12}$; |
| reverse load match | $e'_{11} = a_{22}$; |
| reverse source match | $e'_{22} = b_{22}$; and, |
| reverse transmission tracking | $e_{23}e_{01} = b_{21}a_{12}$. |

11. A method as in claim 7 wherein step (b) comprises the following substeps:

(b.1) performing the calibration in order to generate preliminary systematic error terms for the calibration; and, (b.2) using the preliminary systematic error terms generated in step (b.1) and the scattering parameters for the adapter obtained in step (a) in order to generate the systematic error terms which do not include effects of the adapters.

12. A method as in claim 11 wherein in step (a) the scattering parameters for the adapters are obtained by characterizing the adapters to generate the scattering parameters.

13. A method as in claim 11 wherein in substep (b.2) the systematic error terms ($e_{00}$, $e_{10}e_{01}$, $e_{11}$, $e_{22}$, $e_{10}e_{32}$, $e_{33}$, $e_{23}e_{32}$, $e'_{11}$, $e'_{22}$, $e_{23}e_{01}$) are generated using the scattering parameters ($a_{11}$, $a_{12}$, $a_{21}$, $a_{22}$, $b_{11}$, $b_{12}$, $b_{21}$ and $b_{22}$) and the preliminary systematic error terms ($f_{00}$, $f_{10}e_{01}$, $f_{11}$, $f_{22}$, $f_{10}f_{32}$, $f_{33}$, $f_{23}f_{32}$, $f'_{11}$, $f'_{22}$, $f_{23}f_{01}$) as set out below:

forward directivity:

$$e_{00} = f_{00} + \frac{a_{11}f_{10}f_{01}}{a_{11}a_{22} - a_{12}a_{21} - a_{11}f_{11}};$$

forward reflection tracking:

$$e_{10}e_{01} = \frac{a_{21}a_{12}f_{10}f_{01}}{(a_{11}a_{22} - a_{12}a_{21} - a_{11}f_{11})^2};$$

forward source match:

$$e_{11} = \frac{a_{22} - f_{11}}{a_{11}a_{22} - a_{12}a_{21} - a_{11}f_{11}};$$

forward load match:

$$e_{22} = \frac{b_{22} - f_{22}}{b_{11}b_{22} - b_{12}b_{21} - a_{22}f_{22}};$$

forward transmission tracking:

$$e_{10}e_{32} = \frac{a_{12}b_{21}f_{10}f_{32}}{(a_{11}a_{22} - a_{12}a_{21} - a_{11}f_{11})(b_{11}b_{22} - b_{12}b_{21} - a_{22}f_{22})};$$

reverse directivity:

$$e_{33} = f_{33} + \frac{b_{11}f_{32}f_{23}}{b_{11}b_{22} - b_{12}b_{21} - b_{11}f_{22}};$$

reverse reflection tracking:

$$e_{23}e_{32} = \frac{b_{12}b_{21}f_{23}f_{32}}{(b_{11}b_{22} - b_{12}b_{21} - a_{22}f_{22})^2};$$

reverse load match:

$$e'_{11} = \frac{a_{22} - f'_{11}}{a_{11}a_{22} - a_{12}a_{21} - a_{11}f'_{11}};$$

reverse source match:

$$e'_{22} = \frac{b_{22} - f'_{22}}{b_{11}b_{22} - b_{12}b_{21} - a_{22}f'_{22}}; \quad \text{and,}$$

reverse transmission tracking:

$$e_{23}e_{01} = \frac{a_{21}b_{12}f_{01}f_{23}}{(b_{11}b_{22} - b_{12}b_{21} - a_{22}f_{22})(a_{11}a_{22} - a_{12}a_{21} - a_{11}f_{11})}.$$

14. A method as in claim 7 wherein in step (a) the scattering parameters for the adapters are obtained by characterizing the adapters to generate the scattering parameters.

* * * * *